US012183659B2

(12) United States Patent
Haba

(10) Patent No.: US 12,183,659 B2
(45) Date of Patent: Dec. 31, 2024

(54) EMBEDDED COOLING ASSEMBLIES FOR ADVANCED DEVICE PACKAGING AND METHODS OF MANUFACTURING THE SAME

(71) Applicant: Adeia Semiconductor Bonding Technologies Inc., San Jose, CA (US)

(72) Inventor: Belgacem Haba, Saratoga, CA (US)

(73) Assignee: Adeia Semiconductor Bonding Technologies Inc., San Jose, CA (US)

(*) Notice: Subject to any disclaimer, the term of this patent is extended or adjusted under 35 U.S.C. 154(b) by 0 days.

(21) Appl. No.: 18/397,505

(22) Filed: Dec. 27, 2023

(65) Prior Publication Data
US 2024/0222226 A1    Jul. 4, 2024

Related U.S. Application Data

(60) Provisional application No. 63/435,921, filed on Dec. 29, 2022.

(51) Int. Cl.
*H01L 23/473* (2006.01)
*H01L 23/00* (2006.01)
(Continued)

(52) U.S. Cl.
CPC .......... *H01L 23/473* (2013.01); *H01L 23/427* (2013.01); *H01L 23/467* (2013.01);
(Continued)

(58) Field of Classification Search
CPC .................................................. H01L 23/473
See application file for complete search history.

(56) References Cited

U.S. PATENT DOCUMENTS 4,274,479 A    6/1981 Eastman
5,309,986 A    5/1994 Itoh
(Continued)

FOREIGN PATENT DOCUMENTS

CN    109524373 A    3/2019
CN    111128976 B    10/2021
(Continued)

OTHER PUBLICATIONS

Kaplan, F. et al., "LoCool: Fighting Hot Spots Locally for System Energy Efficiency" IEEE Transactions on Computer-Aided Design of Intergrated Circuits and Systems, 39(4):895-908 (2020).
(Continued)

*Primary Examiner* — David A Zarneke
(74) *Attorney, Agent, or Firm* — Haley Guiliano LLP

(57) ABSTRACT

A device package may include a package substrate, a package cover disposed on the package substrate, and an integrated cooling assembly disposed between the package substrate and the package cover. The package cover generally has an inlet opening and an outlet opening disposed there through. The integrated cooling assembly includes a semiconductor device and a cold plate attached to the semiconductor device. The device package may include a material layer between the package cover and the cold plate. The cold plate may include a patterned first side and an opposite second side. The patterned first side may include a base surface and sidewalls extending downward from the base surface, where the base surface is spaced apart from the semiconductor device to collectively define a coolant channel. Here, the coolant channel is in fluid communication with the inlet opening and the outlet opening through openings disposed through respective portions of the material layer.

20 Claims, 13 Drawing Sheets

(51) Int. Cl.
  *H01L 23/427* (2006.01)
  *H01L 23/467* (2006.01)
  *H01L 25/18* (2023.01)
  *H10B 80/00* (2023.01)
(52) U.S. Cl.
  CPC ............ *H01L 24/08* (2013.01); *H01L 24/16* (2013.01); *H01L 24/32* (2013.01); *H01L 24/73* (2013.01); *H01L 24/80* (2013.01); *H01L 25/18* (2013.01); *H01L 2224/08245* (2013.01); *H01L 2224/16225* (2013.01); *H01L 2224/32225* (2013.01); *H01L 2224/73204* (2013.01); *H01L 2224/80009* (2013.01); *H01L 2224/80357* (2013.01); *H01L 2224/80379* (2013.01); *H01L 2224/80486* (2013.01); *H01L 2224/80896* (2013.01); *H01L 2924/01006* (2013.01); *H01L 2924/04642* (2013.01); *H01L 2924/05042* (2013.01); *H01L 2924/0544* (2013.01); *H01L 2924/059* (2013.01); *H10B 80/00* (2023.02)

(56) References Cited

U.S. PATENT DOCUMENTS

| | | | |
|---|---|---|---|
| 5,522,452 | A | 6/1996 | Mizuno et al. |
| 5,769,154 | A | 6/1998 | Adkins et al. |
| 6,056,044 | A | 5/2000 | Benson et al. |
| 6,351,384 | B1 | 2/2002 | Daikoku et al. |
| 6,686,532 | B1 | 2/2004 | Macris |
| 6,822,326 | B2 | 11/2004 | Enquist et al. |
| 7,289,326 | B2 | 10/2007 | Heydari et al. |
| 7,485,957 | B2 | 2/2009 | Brandenburg et al. |
| 7,511,372 | B2 | 3/2009 | Chiu |
| 7,523,617 | B2 | 4/2009 | Venkatasubramanian et al. |
| 7,622,324 | B2 | 11/2009 | Enquist et al. |
| 7,692,926 | B2 | 4/2010 | Henderson et al. |
| 7,957,137 | B2 | 6/2011 | Prasher |
| 7,978,473 | B2 | 7/2011 | Campbell et al. |
| 7,997,087 | B2 | 8/2011 | Venkatasubramanian et al. |
| 8,164,169 | B2 | 4/2012 | Chrysler et al. |
| 8,630,091 | B2 | 1/2014 | Ward et al. |
| 9,224,673 | B2 | 12/2015 | Chen et al. |
| 9,299,641 | B2 | 3/2016 | Sekar et al. |
| 9,355,932 | B2 | 5/2016 | Ankireddi et al. |
| 9,391,143 | B2 | 7/2016 | Tong et al. |
| 9,553,071 | B1 | 1/2017 | Haba |
| 9,741,638 | B2 | 8/2017 | Hsieh et al. |
| 9,741,696 | B2 | 8/2017 | Katkar et al. |
| 9,746,248 | B2 | 8/2017 | Semenov et al. |
| 9,768,149 | B2 | 9/2017 | Vadhavkar et al. |
| 9,818,723 | B2 | 11/2017 | Haba |
| 1,032,695 | A1 | 7/2018 | Iyengar et al. |
| 10,032,695 | B2 | 7/2018 | Iyengar et al. |
| 1,083,934 | A1 | 9/2018 | Haba |
| 10,083,934 | B2 | 9/2018 | Haba |
| 10,157,818 | B2 | 12/2018 | Chen et al. |
| 10,170,392 | B2 | 1/2019 | Chainer et al. |
| 10,199,356 | B2 | 2/2019 | Kinsley |
| 10,312,221 | B1 | 6/2019 | Agarwal et al. |
| 10,332,823 | B2 | 6/2019 | Chen et al. |
| 10,461,059 | B2 | 10/2019 | Koopmans et al. |
| 10,694,641 | B2 | 6/2020 | Basu et al. |
| 10,978,427 | B2 | 4/2021 | Li et al. |
| 11,187,469 | B2 | 11/2021 | Karesh |
| 11,387,164 | B2 | 7/2022 | Wu et al. |
| 11,598,594 | B2 | 3/2023 | Lewis et al. |
| 11,996,351 | B2 | 5/2024 | Hsiao et al. |
| 2003/0157782 | A1 | 8/2003 | Kellar et al. |
| 2004/0184237 | A1 | 9/2004 | Chang |
| 2004/0251530 | A1 | 12/2004 | Yamaji |
| 2005/0126766 | A1 | 6/2005 | Lee et al. |
| 2005/0213301 | A1 | 9/2005 | Prasher |
| 2006/0042825 | A1 | 3/2006 | Lu et al. |
| 2006/0103011 | A1 | 5/2006 | Andry et al. |
| 2007/0025082 | A1 | 2/2007 | Lee et al. |
| 2007/0107875 | A1 | 5/2007 | Lee et al. |
| 2008/0096320 | A1 | 4/2008 | Farrar |
| 2009/0122491 | A1 | 5/2009 | Martin et al. |
| 2010/0116534 | A1 | 5/2010 | Choi et al. |
| 2010/0230805 | A1 | 9/2010 | Refai-Ahmed |
| 2010/0300202 | A1 | 12/2010 | Joyce |
| 2011/0129986 | A1 | 6/2011 | Libralesso et al. |
| 2013/0044431 | A1 | 2/2013 | Koeneman |
| 2013/0050944 | A1 | 2/2013 | Shepard |
| 2013/0087904 | A1 | 4/2013 | Clark et al. |
| 2014/0126150 | A1 | 5/2014 | Song et al. |
| 2015/0194363 | A1 | 7/2015 | Jun et al. |
| 2016/0276314 | A1 | 9/2016 | Ching et al. |
| 2017/0012016 | A1 | 1/2017 | Joshi et al. |
| 2017/0092565 | A1 | 3/2017 | Chen et al. |
| 2017/0103937 | A1 | 4/2017 | Hsieh et al. |
| 2018/0053730 | A1 | 2/2018 | Shao et al. |
| 2018/0087842 | A1 | 3/2018 | Chainer et al. |
| 2018/0090427 | A1 | 3/2018 | Bernstein et al. |
| 2018/0160565 | A1 | 6/2018 | Parida |
| 2018/0211900 | A1 | 7/2018 | Gutala et al. |
| 2018/0308783 | A1 | 10/2018 | Refai-Ahmed et al. |
| 2019/0008071 | A1 | 1/2019 | Kim |
| 2019/0355706 | A1 | 11/2019 | Enquist et al. |
| 2019/0385928 | A1 | 12/2019 | Leobandung |
| 2020/0035583 | A1 | 1/2020 | Beauchemin et al. |
| 2020/0105639 | A1 | 4/2020 | Valavala et al. |
| 2020/0312742 | A1 | 10/2020 | Lofgreen et al. |
| 2020/0343160 | A1 | 10/2020 | Mizerak et al. |
| 2020/0350233 | A1 | 11/2020 | Mizerak et al. |
| 2020/0352053 | A1 | 11/2020 | Mizerak et al. |
| 2020/0395313 | A1 | 12/2020 | Mallik et al. |
| 2021/0066164 | A1 | 3/2021 | Wu et al. |
| 2021/0175143 | A1 | 6/2021 | Yu et al. |
| 2021/0183741 | A1 | 6/2021 | Jha et al. |
| 2021/0193548 | A1 | 6/2021 | Wan et al. |
| 2021/0193620 | A1 | 6/2021 | Refai-Ahmed et al. |
| 2021/0280497 | A1 | 9/2021 | Brun et al. |
| 2021/0288037 | A1 | 9/2021 | Tao et al. |
| 2021/0378106 | A1 | 12/2021 | Iyengar et al. |
| 2021/0378139 | A1 | 12/2021 | Rice et al. |
| 2021/0410329 | A1 | 12/2021 | Yang et al. |
| 2022/0037231 | A1 | 2/2022 | Hsiao et al. |
| 2022/0087059 | A1 | 3/2022 | Sathyamurthy et al. |
| 2022/0117115 | A1 | 4/2022 | Malouin et al. |
| 2022/0130734 | A1 | 4/2022 | Chiu et al. |
| 2022/0189850 | A1 | 6/2022 | Liff et al. |
| 2022/0210949 | A1 | 6/2022 | Edmunds et al. |
| 2022/0230937 | A1 | 7/2022 | Malouin et al. |
| 2022/0408592 | A1 | 12/2022 | Malouin et al. |
| 2023/0048500 | A1 | 2/2023 | Malouin et al. |
| 2023/0154828 | A1 | 5/2023 | Haba et al. |
| 2023/0156959 | A1 | 5/2023 | Malouin et al. |
| 2023/0207474 | A1 | 6/2023 | Uzoh et al. |
| 2023/0245950 | A1 | 8/2023 | Haba et al. |
| 2023/0284421 | A1 | 9/2023 | Malouin et al. |
| 2023/0298969 | A1 | 9/2023 | Park et al. |
| 2024/0038633 | A1 | 2/2024 | Haba et al. |
| 2024/0203823 | A1 | 6/2024 | Uzoh et al. |
| 2024/0222222 | A1 | 7/2024 | Haba et al. |
| 2024/0249995 | A1 | 7/2024 | Haba |
| 2024/0249998 | A1 | 7/2024 | Gao et al. |
| 2024/0266255 | A1 | 8/2024 | Haba et al. |

FOREIGN PATENT DOCUMENTS

| | | |
|---|---|---|
| CN | 115719735 A | 2/2023 |
| JP | 2000-340727 A | 12/2000 |
| KR | 10-1049508 B1 | 7/2011 |
| KR | 10-2023-0136509 A | 9/2023 |
| TW | 200834871 A | 8/2008 |
| WO | 2013/097146 A1 | 7/2013 |

OTHER PUBLICATIONS

Evan G. Colgan, "A Practical Implementation Of Silicon Microchannel Coolers", available online at <https://www.electronics-cooling.

(56) References Cited

OTHER PUBLICATIONS com/2007/11/a-practical-implementation-of-silicon-microchannel-coolers/>, Nov. 1, 2007, 10 pages.

Francisco Pires, "TSMC Exploring On-Chip, Semiconductor-Integrated Watercooling", tom's Hardware, retrieved from https://www.tomshardware.com/news/tsmc-exploring-on-chip-semiconductor-integrated-watercooling, Jul. 13, 2021, 23 pages.

IBM, "Functional electronic packaging-Thermal management roadmap", available online at <https://web.archive.org/web/20170220095511/https://www.zurich.ibm.com/st/electronicpackaging/cooling.html>, Feb. 20, 2017, 7 pages.

International Search Report and Written Opinion received for PCT Patent Application No. PCT/US23/28942, mailed on Nov. 16, 2023, 12 pages.

International Search Report and Written Opinion received for PCT Patent Application No. PCT/US23/84874, mailed on Apr. 22, 2024, 7 pages.

International Search Report and Written Opinion received for PCT Patent Application No. PCT/US23/85801, mailed on Apr. 26, 2024, 8 pages.

International Search Report and Written Opinion received for PCT Patent Application No. PCT/US23/85816, mailed on Apr. 23, 2024, 11 pages.

International Search Report and Written Opinion received for PCT Patent Application No. PCT/US23/86233, mailed on Apr. 26, 2024, 7 pages.

U.S. Appl. No. 18/129,567, filed Mar. 31, 2023, First Name Inventor: Cyprian Emeka Uzoh, "Embedded Cooling Systems for Device Packages and Methods of Cooling Packaged Devices".

PCT Application No. PCT/US2024/022253, International Search Report and Written Opinion dated Jul. 17, 2024, 14 pages.

Shamsa, M., et al., "Thermal conductivity of diamond-like carbon films", Applied Physics Letters, vol. 89, No. 16, Oct. 20, 2006, pp. 161921-161921-3.

Wu, C. J., et al., "Ultra High Power Cooling Solution for 3D-Ics", 2021 Symposium on VLSI Technology, Jun. 2021, 2 pages.

Benson D.A. et al., "Micro-Machined Heat Pipes in Silicon MCM Substrates", Sandia National Laboratories, Sandia Report: SAND97-0100-UC-704, printed Jan. 1997, 17 pages.

Colgan, Evan G., "A practical implementation of silicon microchannel coolers," Electronics Cooling, Nov. 1, 2007, http://www.electronics-cooling.com/2007/11/a-practical-implementation-of-silicon-microchannel-coolers, printed May 23, 2023, 11 pages.

Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 7 pages.

"KoolMicro Inc. developed the World's First 2,000 W/cm2 Cooling Technology for High Heat Generation Chips," Press Release, 2 pages, downloaded from www.semiconductorpackagingnews.com/uploads/1/KoolMicro_High_Cooling_Power_Density.pdf on Nov. 22, 2023.

"Microconvective Liquid Cooling for high power electronics," https://jetcool.com/technology/, downloaded Mar. 7, 2024, 6 pages.

"Single-Phase Direct-to-Chip Liquid Cooling," 6 pages, downloaded from https://jetcool.com/post/single-phase-direct-to-chip-liquid-cooling-microconvective-vs-microchannel-liquid-cooled-coldplates/ on Mar. 7, 2024.

Walsh, Stephen Michael, "Microjet Impingement Cooling of High Power-Density Electronics," Thesis, submitted May 11, 2018, 93 pages.

International Search Report and Written Opinion mailed Mar. 16, 2023, in International Application No. PCT/US2022/050105, 9 pages.

International Search Report and Written Opinion mailed May 30, 2023, in International Application No. PCT/US2023/061494, 9 pages.

International Search Report and Written Opinion mailed Jun. 5, 2024, in International Application No. PCT/US2024/013758, 9 pages.

Lien, Yu-Jen, et al., "An Energy-efficient Si-integrated Micro-cooler for High Power and Power-density Computing Applications", 2024 IEEE 74th ECTC, 5 pages.

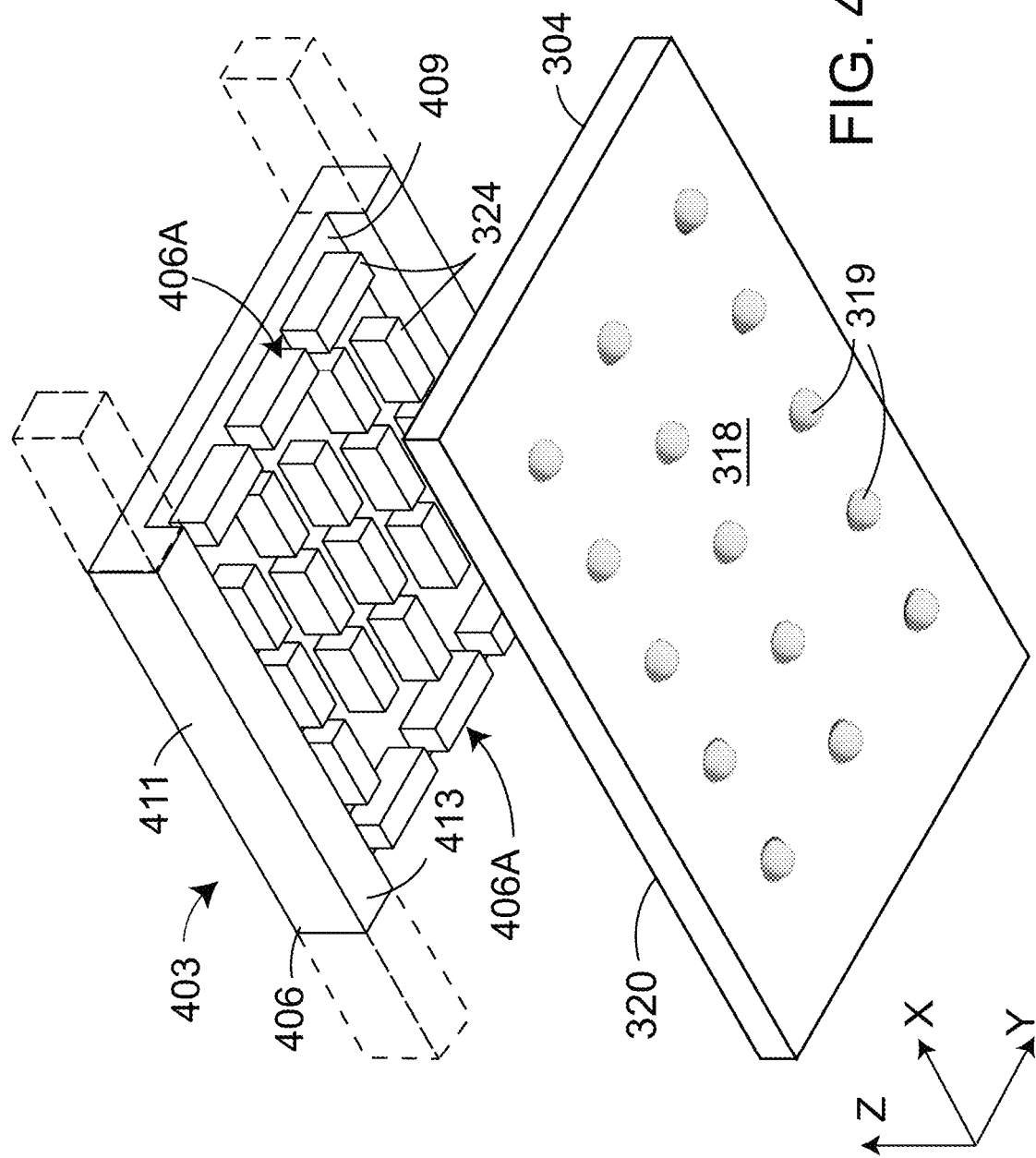

EMBEDDED COOLING ASSEMBLIES FOR ADVANCED DEVICE PACKAGING AND METHODS OF MANUFACTURING THE SAME

FIELD

The present disclosure relates to advanced packaging for microelectronic devices, and in particular, embedded cooling systems for device packages and methods of manufacturing the same.

BACKGROUND

Energy consumption poses a critical challenge for the future of large-scale computing as the world's computing energy requirements are rising at a rate that most would consider unsustainable. Some models predict that the information and communications and technology (ICT) ecosystem could exceed 20% of global electricity use by 2030, with direct electrical consumption by large-scale computing centers accounting for more than one-third of that energy usage. Cooling costs make up a significant portion of computing center energy requirements as even small increases in operating temperatures can negatively impact the performance of microprocessors, memory devices, and other electronic components.

Thermal dissipation in high-power density chips is also a critical challenge as improvements in chip performance, e.g., through increased gate density and multi-core microprocessors, have resulted in increased power density and a corresponding increase in thermal flux that contributes to elevated chip temperatures. These elevated temperatures are undesirable as they can degrade the chip's operating performance, efficiency, and reliability. Cooling systems used to maintain the chip at a desired operating temperature typically remove heat using one or more heat dissipation devices, e.g., thermal spreaders, heat pipes, cold pipes, and heat sinks, which are thermally coupled to the chip using a compliant thermally conductive material (TIM), e.g., thermal pastes, thermal adhesives, thermal gap fillers, etc. The thermal interface material maintains thermal contact with the surfaces of the chip and heat dissipation device(s) to facilitate heat transfer therebetween. Unfortunately, the combined thermal resistance of thermal interface materials and the thermal resistance at interfacial boundary regions inhibits heat transfer from the chip to the heat dissipation devices, undesirably reducing the cooling efficiency of the cooling system.

Accordingly, there exists a need in the art for improved energy-efficient cooling systems and methods of manufacturing the same.

SUMMARY

Embodiments herein provide integrated device cooling assemblies embedded in advanced device packages. Advantageously, the integrated device cooling assemblies shorten the thermal resistance path between devices and coolant fluids and reduce thermal communication between devices disposed in the same package.

In one general aspect, a device package may include a package substrate, a package cover disposed on the package substrate, and an integrated cooling assembly disposed between the package substrate and the package cover. The package cover generally has an inlet opening and an outlet opening disposed therethrough. The integrated cooling assembly includes a semiconductor device and a cold plate attached to the semiconductor device. The device package may in addition include a material layer disposed between the package cover and the cold plate. The cold plate may include a patterned first side and an opposite second side. The patterned first side may include a base surface and sidewalls extending downwardly from the base surface, where the base surface is spaced apart from the semiconductor device to collectively define a coolant channel therebetween. Here, the coolant channel is in fluid communication with the inlet opening and the outlet opening through openings disposed through respective portions of the material layer.

Implementations may include a method of manufacturing a device assembly, where the method includes directly bonding a first substrate having a semiconductor device to a second substrate having a cold plate, and singulating an integrated cooling assembly having the semiconductor device and the cold plate from the bonded first and second substrate. The method may further include sealingly attaching a package cover to the second side by use of a material layer, and before or after attaching the package cover to the second side, forming openings in the material layer Here, the cold plate may have a first side directly bonded to the semiconductor device and a second side opposite the first side. Generally, one or more surfaces of first side are spaced apart from the semiconductor device to define a coolant channel therebetween. The package cover may have an inlet opening and an outlet opening. The openings in the material layer may fluidly connect the inlet opening and the outlet opening to the coolant channel.

BRIEF DESCRIPTION OF THE DRAWINGS

The above and other objects and advantages of the disclosure will be apparent upon consideration of the following detailed description, taken in conjunction with the accompanying drawings, in which:

FIG. 4B is an exploded bottom-up isometric view of the integrated cooling assembly illustrated in FIG. 4A;

Figure 1:
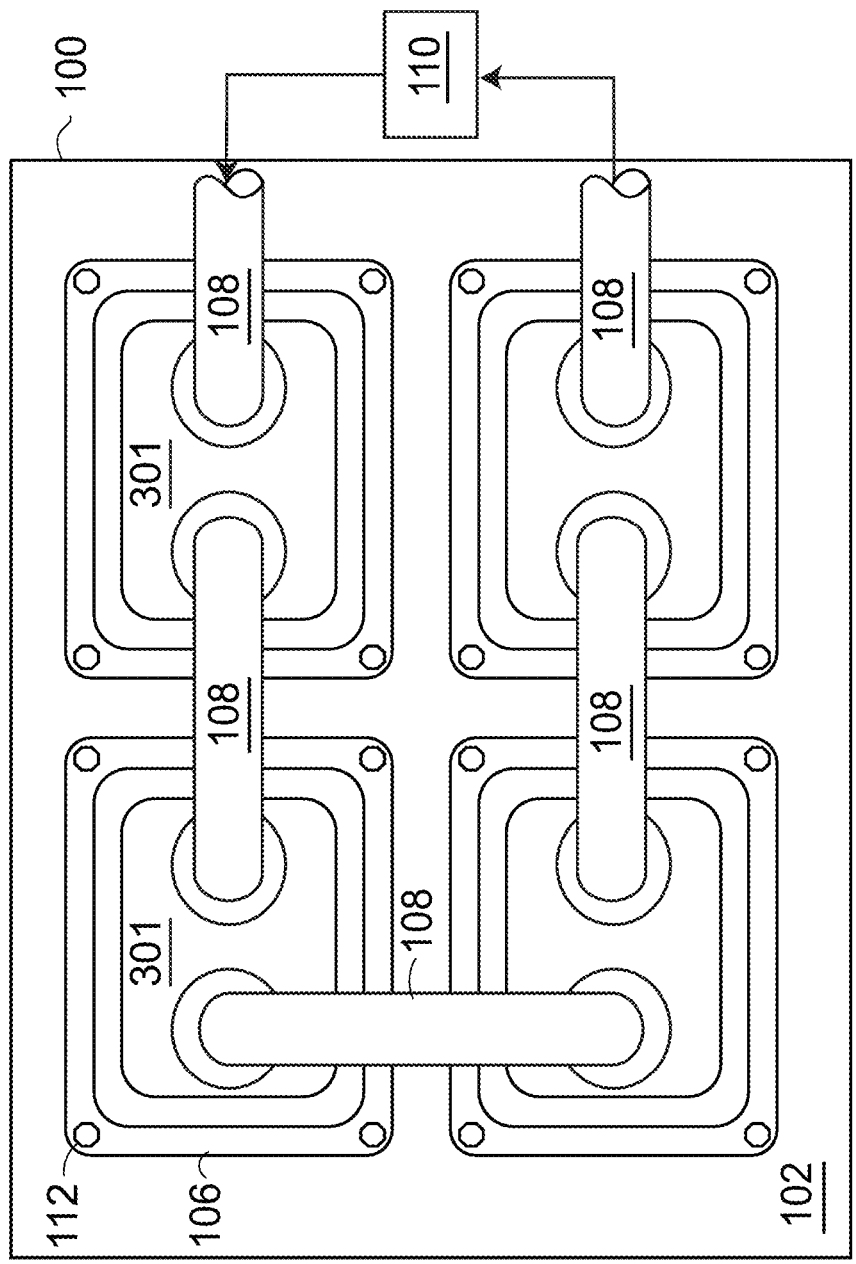
FIG. 1 is a schematic plan view of an example of a system panel, in accordance with embodiments of the disclosure.

The figures herein depict various embodiments of the disclosure for purposes of illustration only. It will be appreciated that additional or alternative structures, assemblies, systems, and methods may be implemented within the principles set out by the present disclosure.

DETAILED DESCRIPTION

Embodiments herein provide for integrated cooling assemblies embedded within a device package. The embedded cooling assemblies shorten the thermal resistance path between a device and a heat sink and reduce thermal communication between devices disposed in the same package.

As used herein, the term "substrate" means and includes any workpiece, wafer, or article that provides a base material or supporting surface from which or upon which components, elements, devices, assemblies, modules, systems, or features of the heat-generating devices, packaging components, and cooling assembly components described herein may be formed. The term substrate also includes "semiconductor substrates" that provide a supporting material upon which elements of a semiconductor device are fabricated or attached, and any material layers, features, and/or electronic devices formed thereon, therein, or therethrough.

As described below, the semiconductor substrates herein generally have a "device side," e.g., the side on which semiconductor device elements are fabricated, such as transistors, resistors, and capacitors, and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that form the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal, e.g., after substrate thinning operations. Depending on the stage of device fabrication or assembly, the terms "active" and "non-active sides" are also used to describe surfaces of material layers or features formed on, in, or through the semiconductor substrate, whether or not the material layers or features are ultimately present in the fabricated or assembled device.

Spatially relative terms are used herein to describe the relationships between elements, such as the relationships between substrates, heat-generating devices, cooling assembly components, device packaging components, and other features described below. Unless the relationship is otherwise defined, terms such as "above," "over," "upper," "upwardly," "outwardly," "on," "below," "under," "beneath," "lower," and the like are generally made with reference to the X, Y, and Z directions set forth in the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," either alone or in combination with a spatially relevant term include both relationships with intervening elements and direct relationships where there are no intervening elements.

Unless otherwise noted, the term "cold plate" generally refers to a base plate, or a stack of base plates directly bonded to one another, which may be bonded to the semiconductor device. The cold plate may include material layers and/or metal features formed on or in a surface of the base plate or stack of base plates that facilitate direct dielectric or hybrid bonding with a semiconductor device. The term "integrated cooling assembly" generally refers to a cold plate attached to a semiconductor device that are attached so as to form a single piece, such as by use of the direct bonding methods described below. The direct bonding methods enable heat from the semiconductor device to be transferred through the cold plate to a coolant fluid flowed thereover without the use of a thermal interface material. Unless otherwise noted, the device packages and cold plates described herein may be used with any desired fluid coolant, e.g., liquid, gas, and/or vapor-phase coolants. Thus, the terms should not be construed as limiting the coolant to any one fluid phase.

Typically, device packages for high heat flux device are cooled with an external heat sink attached to a thermal spreader that forms the packages cover. Devices in the device package are thermally coupled to the package cover using one or more thermal interface materials, e.g., TIM layers disposed therebetween where the TIM layers comprise a compliant material, such as a thermally conductive paste, grease, adhesive material, or other thermally conductive material, such as a fusible metal alloy and the like, e.g., solder, or combinations thereof. Unfortunately, as heat flux density increases with shrinking device size, the cumulative thermal resistance of the components of such device packages is increasingly problematic as heat cannot be dissipated quickly enough to allow the devices to run at optimal power, thus reducing the devices' energy efficiency. Also problematic is that the heat is transferred between devices within a single package, where heat may follow a thermal path from a device having a high heat flux, such as a CPU or GPU, to one or more device having low heat flux, such as memory.

Typically, the thermal resistance of the TIM layers accounts for 80% or more of the cumulative thermal resistance of the heat transfer path between the device and the external heat sink, which bars the levels of cooling efficiency desired for next-generation device packages. Accordingly, embodiments herein provide for integrated cooling assemblies embedded within a device package which shorten the thermal resistance path between a device and a heat sink and reduce thermal communication between devices disposed in the same package.

FIG. 1 is a schematic plan view of an example of a system panel 100, in accordance with embodiments of the disclosure. Here, the system panel 100 includes a printed circuit board, here PCB 102, a plurality of device packages 301 mounted to the PCB 102, and a plurality of coolant lines 108 fluidly coupling each of the device packages 301 and to a coolant source 110. It is contemplated that coolant may be delivered to each of the device packages 301 in any desired fluid phase, e.g., liquid, vapor, gas, or combinations thereof and may flow out from the device package 301 in the same phase or a different phase. In some embodiments the coolant is delivered to the device package 301 and returned therefrom as a liquid and the coolant source 110 may comprise a heat exchanger or chiller to maintain the coolant at a desired temperature. In other embodiments, the coolant may be delivered to the device packages 301 as a liquid, vaporized to a liquid within the device package, and returned to the coolant source 110 as a vapor. In those embodiments, the device packages 301 may be fluidly coupled to the coolant source 110 in parallel and the coolant source 110 may include or further include a compressor (not shown) for condensing the received vapor to a liquid form.

Figure 2:
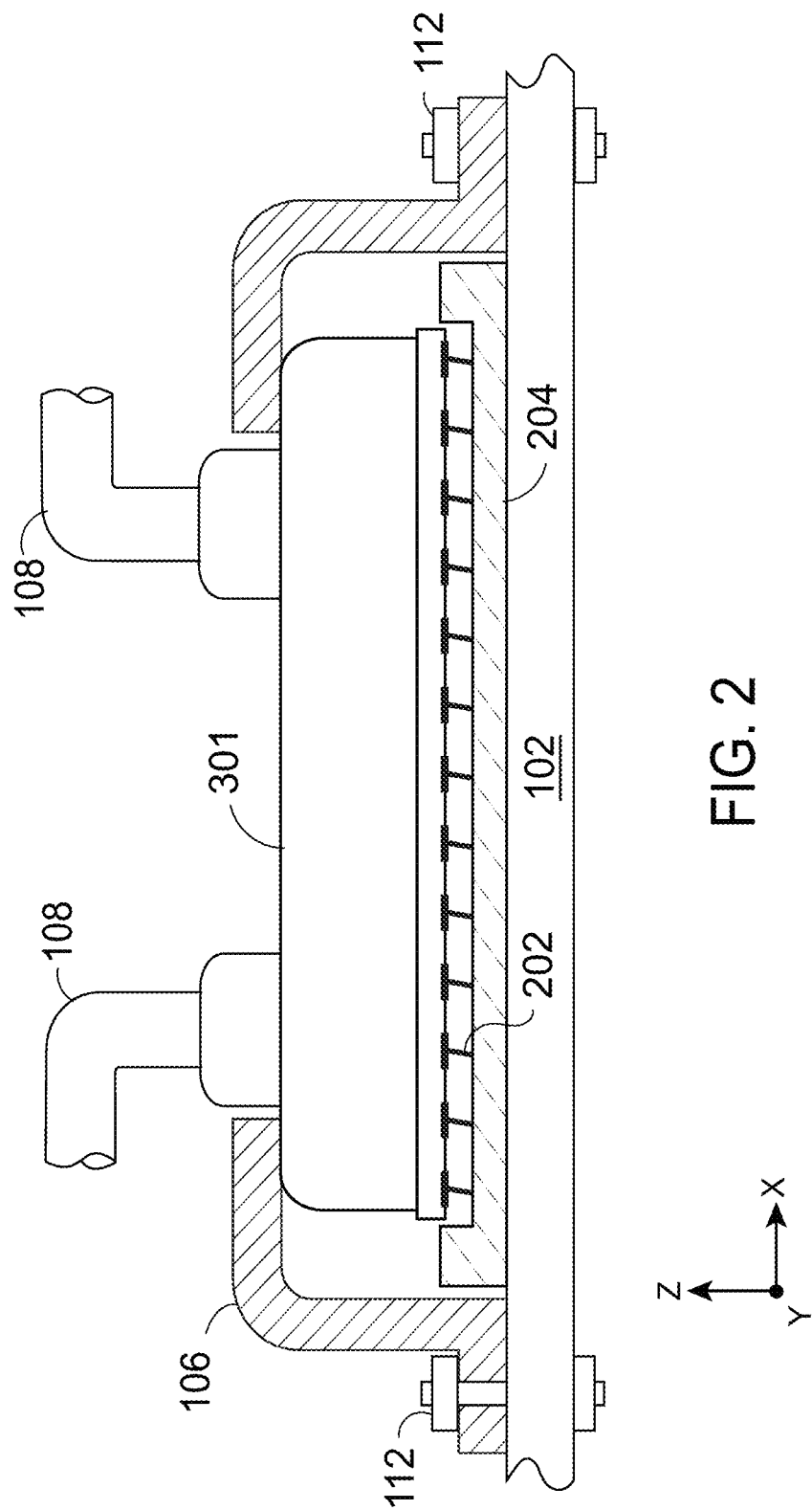
FIG. 2 is a schematic partial sectional side view of a portion of the system panel of FIG. 1.

FIG. 2 is a schematic partial sectional side view of a portion of the system panel 100 of FIG. 1. As shown, each device package 301 is disposed in a socket 204 of the PCB 102 and connected thereto using a plurality of pins 202, or by other suitable connection methods, such as solder bumps (not shown). The device package 301 may be seated in the socket 204 and secured to the PCB 102 using a mounting frame 106 and a plurality of fasteners 112, e.g., compression screws, collectively configured to exert a relatively uniform downward force on the upward facing edges of the device package 301. The uniform downward force ensures proper pin contact between the device package 301 and the socket 204.

Figure 3A:
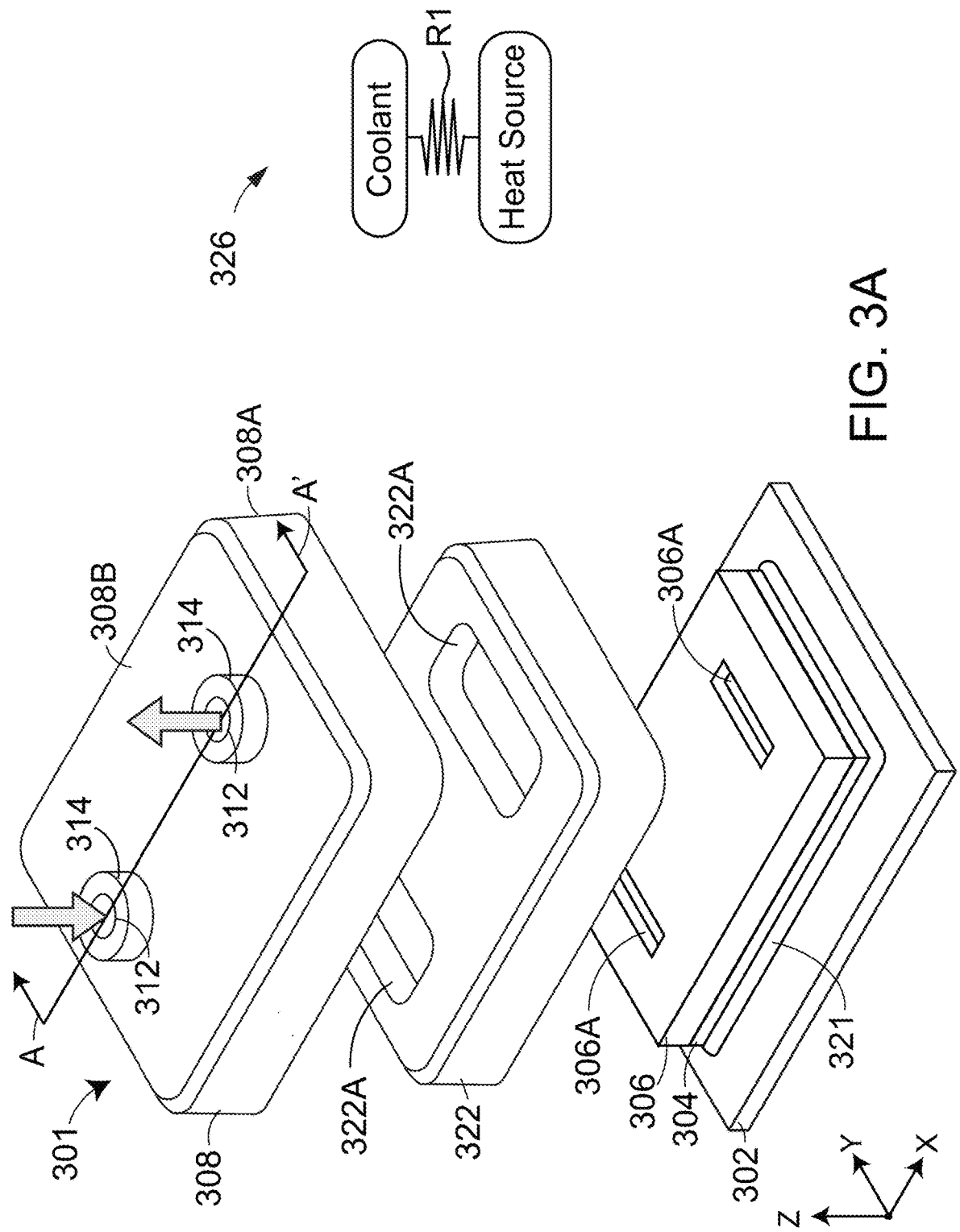
FIG. 3A is a schematic exploded isometric view of an example device package, in accordance with embodiments of the disclosure.
Figure 3B:
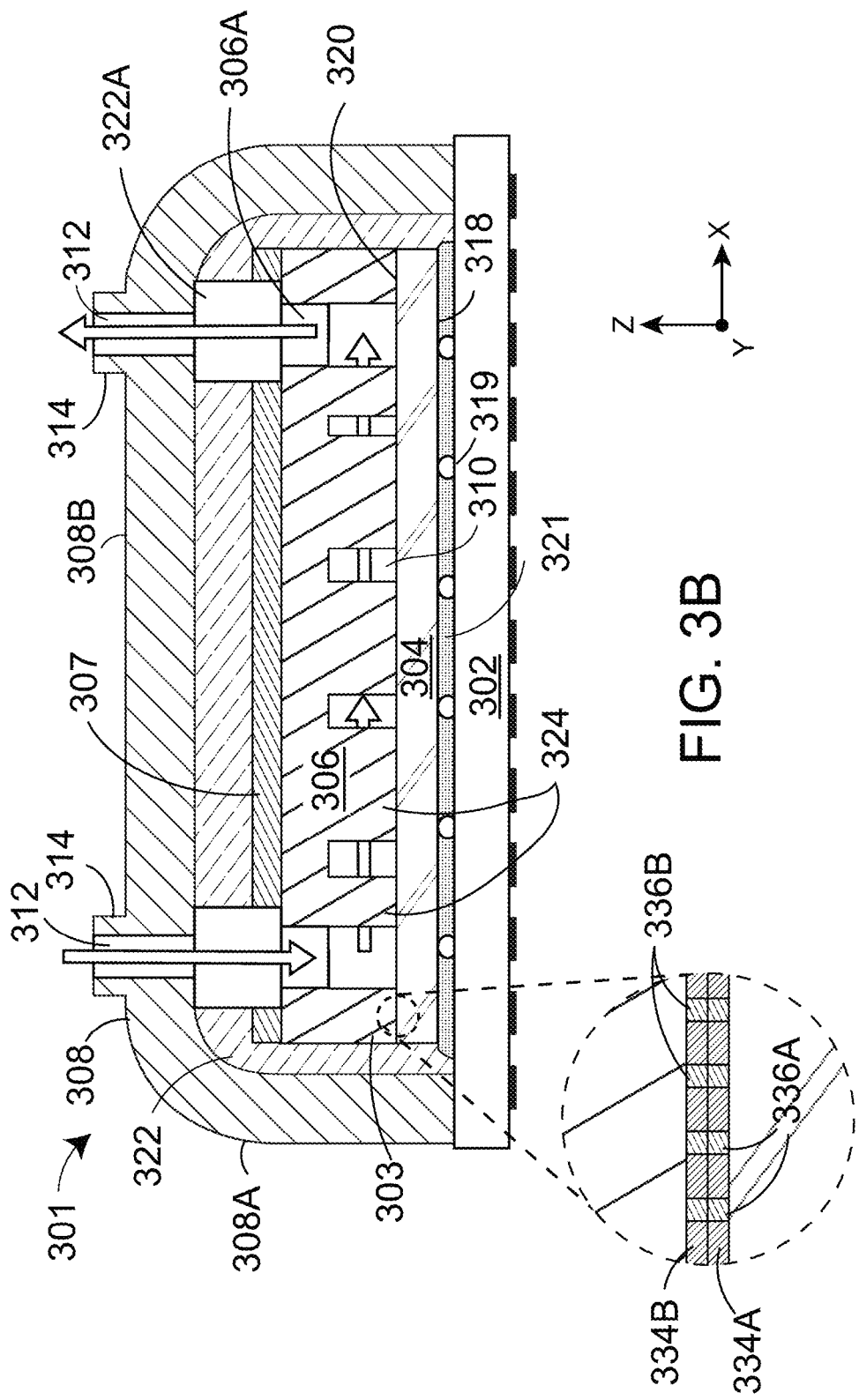
FIG. 3B is a schematic sectional view of the device package taken along line A-A' of FIG. 3A.

FIG. 3A is a schematic exploded isometric view of an example device package 301, in accordance with embodiments of the disclosure. FIG. 3B is a schematic sectional view of the device package 301 taken along line A-A' of FIG. 3A. Generally, the device package 301 includes a package substrate 302, an integrated cooling assembly 303 disposed on the package substrate 302, and a package cover 308 disposed on a peripheral portion of the package substrate 302 and extending over the integrated cooling assembly 303 so that the integrated cooling assembly 303 is disposed between the package substrate 302 and the package cover 308. As shown, the device package 301 further includes a sealing material layer 322 that forms a coolant impermeable barrier between the package cover 308 to the integrated cooling assembly 303. Coolant is delivered to the integrated cooling assembly 303 via inlet/outlet openings 312 in the package cover 308 and corresponding openings 322A formed through the sealing material layer 322. In some embodiments, the device package 301 may further include a support member 307 attached to the integrated cooling assembly 303.

Generally, the package substrate 302 includes a rigid material, such as an epoxy or resin-based laminate, that supports the integrated cooling assembly 303 and the package cover 308. The package substrate 302 may include conductive features disposed in or on the rigid material that electrically couple the integrated cooling assembly 303 to a system panel, such as the PCB 102.

Figure 3C:
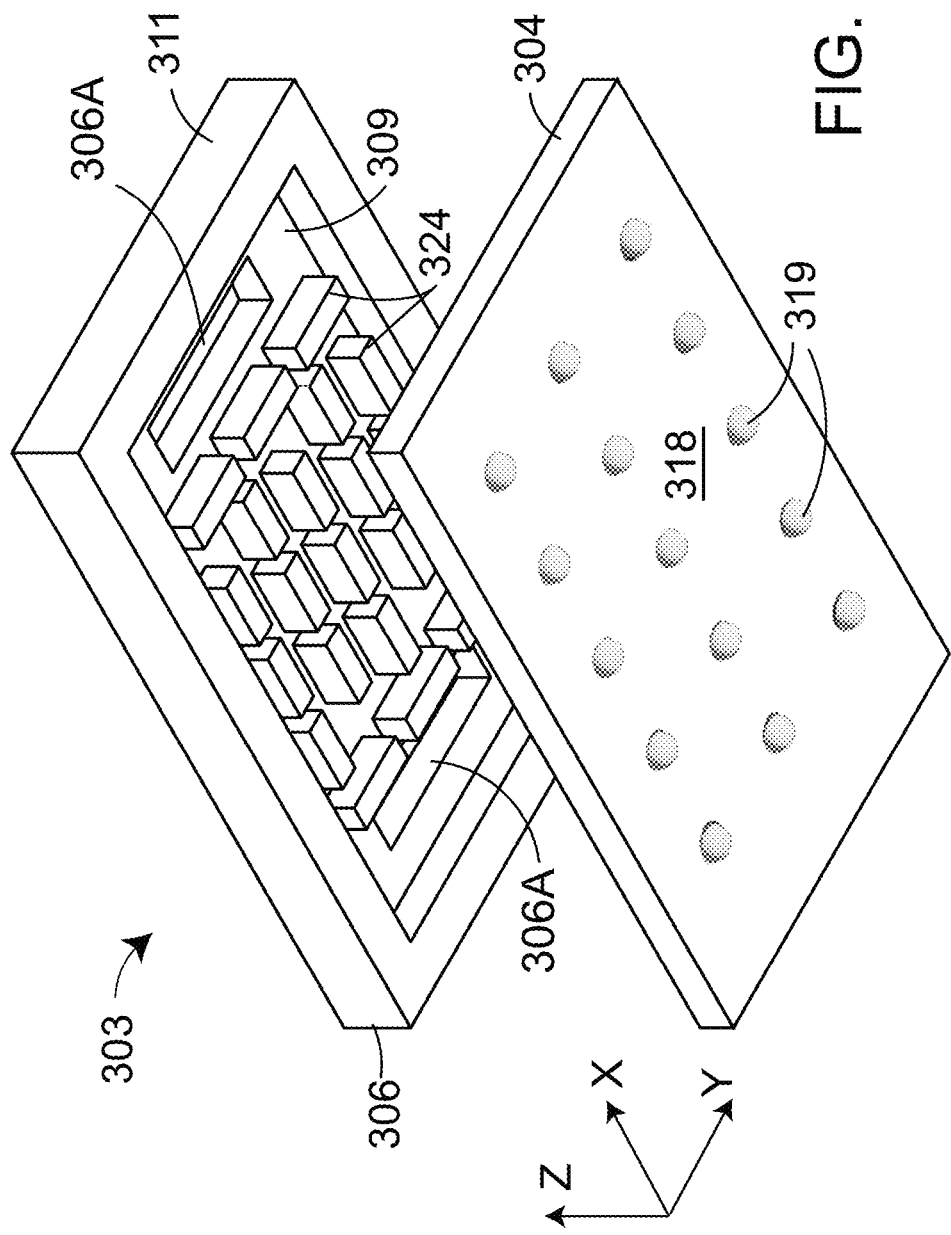
FIG. 3C is a schematic exploded bottom up isometric view of the integrated cooling assembly illustrated in FIG. 3B.

FIG. 3C is a schematic exploded bottom up isometric view of the integrated cooling assembly 303 illustrated in FIG. 3B. As shown, the integrated cooling assembly 303 may include a semiconductor device, here device 304, and a cold plate 306 bonded to the device 304. Here, the device 304 includes an active side 318 that includes device components, e.g., transistors, resistors, and capacitors, formed thereon or therein, and a non-active side, here the device backside 320, opposite the active side 318. As shown, the active side 318 is positioned adjacent to and facing towards the package substrate 302. The active side 318 may be electrically connected to the package substrate 302 by use of conductive bumps 319, which are encapsulated by a first underfill layer 321 disposed between the device 304 and the package substrate 302. The first underfill layer 321 may comprise a cured polymer resin or epoxy, which provides mechanical support to the conductive bumps 319 and protects against thermal fatigue.

As shown in FIGS. 3B-3C, the cold plate 306 generally includes a patterned side that faces towards the device 304 and defines the upper portion of a coolant channel 310 when the cold plate 306 is attached to the device backside 320, and an opposite side that faces towards the package cover 308. Here, the patterned side forms a device facing cavity comprising a base surface 309 and sidewalls 311 that surround the base surface 309 and protrude downwardly therefrom. When attached to the device 304 disposed therebelow, the sidewalls 311 form a perimeter of the coolant channel 310 and the base surface 309 forms an uppermost surface of the coolant channel 310. The device backside 320 forms the bottom of the coolant channel 310 and is in direct thermal contact with coolant flowed therethrough. Here, coolant is circulated through the coolant channel 310 through openings disposed through the cold plate 306, shown here as openings 306A disposed between the downwardly facing base surface 309 and an opposite upwardly facing surface. The openings 306A are in fluid communication with the inlet/outlet openings 312 of the package cover 308 through openings 322A formed in the sealing material layer 322 disposed therebetween.

In some embodiments, the cold plate 306 includes a plurality of protruding features 324, such as fins, columns, or pillars that extend downwardly from the base surface 309. The protruding features 324 may be attached to the device 304, or extend proximate thereto, to disrupt laminar fluid flow at the interface of the coolant and the device backside 320 resulting in increased heat transfer therebetween. To further increase heat dissipation from the device 304, the protruding features 324 may comprise and/or be formed of a thermally conductive metal, such as copper. The protruding features 324 may be arranged in a repeating pattern as shown or may be a random or non-repeating pattern. It is contemplated that each embodiment of the device packages described herein may include a cold plate having a patterned side that comprises a base surface 309, sidewalls 311, and a plurality of the protruding features 324 without the explicit recitation thereof.

Here, the cold plate 306 is attached to the device backside 320 without the use of an intervening adhesive material, e.g., the cold plate 306 may be directly bonded to the device backside 320, such that the cold plate 306 and the device backside 320 are in direct thermal contact. In some embodiments, the cold plate 306 is attached to the device backside 320 using a direct dielectric bonding process. In other embodiments, the cold plate 306 is attached to the device backside 320 using a hybrid of direct dielectric bonds and direct metal bonds formed therebetween. For example, in some embodiments, one or both of the device backside 320 and the device-facing side of the cold plate 306 comprise a dielectric material layer, e.g., a first dielectric material layer 334A and a second dielectric material layer 334B respectively and the cold plate 306 is directly bonded to the device backside 320 through bonds formed between the dielectric material layers 334A-B. In some embodiments, the cold plate 306 is directly bonded to the device backside 320 using a hybrid bonding technique, where bonds are formed between the dielectric material layers 334A-B and between metal features, such as between first metal pads 336A and second metal pads 336B, disposed in the dielectric material layers 334A-B.

Suitable dielectrics that may be used as the dielectric material layers 334A-B include silicon oxides, silicon nitrides, silicon oxynitrides, silicon carbon nitrides, metal-oxides, metal-nitrides, silicon carbide, silicon oxycarbides, silicon oxycarbonitride, silicon carbonitride, diamond-like carbon (DLC), or combinations thereof. In some embodiments, one or both of the dielectric material layers 334A-B are formed of an inorganic dielectric material, i.e., a dielectric material substantially free of organic polymers. Typically, one or both of the dielectric layers 334A-B are deposited to a thickness greater than the thickness of a native oxide, such as about 1 nm or more, 5 nm or more, 10 nm or more, 50 nm or more, 100 nm or more, or 100 nm or more. In some embodiments, the one or both of the layers 334A-B are deposited to a thickness of 300 nm or less, such as 100 nm or less, 100 nm or less, or 50 nm or less.

In some embodiments, the cold plate 306 is formed of a material having a coefficient of thermal expansion (CTE) substantially similar to the CTE of the bulk semiconductor substrate of device 304. For example, in some embodiments, the device 304 may be formed on a monocrystalline silicon substrate, and the cold plate 306 may be formed from a monocrystalline silicon or polycrystalline silicon substrate. Forming the cold plate 306 from CTE matched materials (with respect to the bulk substrate material of the device 304) prevents undesired separation of the device 304 and cold plate 306 across repeated thermal cycles.

In some embodiments, the cold plate 306 may be formed from non-crystalline silicon materials, such as a bulk substrate material comprising metal, metal alloys, ceramics, composite materials or other low CTE materials suitable for the bonding using the methods described below. For example, the cold plate 306 may be formed from a bulk material selected from the group comprising copper, aluminum, copper alloys (e.g., copper molybdenum alloys and copper tungsten alloys), iron-cobalt nickel alloys (e.g., Kovar® from Magellan Industrial Trading Co., Inc. of South Norwalk Connecticut USA), iron-cobalt nickel silver alloys, iron-nickel alloys (e.g., Invar® superalloys from Magellan), iron-nickel silicon alloys, aluminum silicon carbides, aluminum-silicon alloys, beryllium, beryllium oxides, beryllium, and beryllium oxide composites, aluminum-graphite fibers, copper-graphite fibers, metal diamond composite materials (e.g., aluminum diamond composites and silver-diamond composites), metal oxides, metal nitrides, and combinations thereof. The non-silicon substrate materials may be prepared for bonding as described below and may or may not include a dielectric material layer deposited on the device-facing side to form a bonding surface. Methods for forming direct dielectric and hybrid bonds are described below.

Beneficially, the device package 301 provides for reduced thermal resistance in the heat transfer path 326 when compared thermal heat transfer path to an external heat sink. In some embodiments, the cumulative thermal resistance of the heat transfer path 326 is reduced by 50X or more when compared to the cumulative resistance of a device package cooled using an external heat sink.

The package cover 308 generally comprises one or more vertical or sloped sidewall portions 308A and a lateral portion 308B that spans and connects the sidewall portions 308A. The sidewall portions 308A extend upwardly from a peripheral surface of the package substrate 302 to surround the device 304 and the cold plate 306 disposed thereon. The lateral portion 308B is disposed over the cold plate 306 and is typically spaced apart from the cold plate 306 by a gap corresponding to the thickness of the sealing material layer 322. Coolant is circulated through the coolant channel 310 through the inlet/outlet openings 312 formed through the lateral portion 308B. In each of the embodiments described herein, coolant lines 108 may be attached to the device package 301 by use of connector features formed in the package cover 308, such as threads formed in the sidewalls of the inlet/outlet openings 312 and/or protruding features 314 that surround the openings 312 and extend upwardly from a surface of the lateral portion 308B.

Typically, the package cover 308 is formed of semi-rigid or rigid material so that at least a portion of the downward force exerted on the package cover 308 by the mounting frame 106 (FIG. 2) is transferred to the supporting surface of the package substrate 302 and not transferred to the cold plate 306 and the device 304 therebelow. In some embodiments, the package cover 308 is formed of a thermally conductive metal, such as aluminum or copper. In some embodiments, the package cover 308 functions as a heat spreader that redistributes heat from one or more electronic components within a multi-component device package, such as described below.

The sealing material layer 322 forms an impermeable barrier between the integrated cooling assembly 303 and the package cover 308 that prevents coolant from reaching the active side 318 of the device 304 and causing damage thereto. In some embodiments, the sealing material layer 322 comprises a polymer or epoxy material that extends upwardly from the package substrate 302 to encapsulate and/or surround at least a portion of the device 304. In other embodiments, the sealing material layer 322 may be disposed between only the upward facing surface of the cold plate 306 and the portion of the package cover 308 disposed thereover. In some embodiments, the sealing material layer is formed from a molding compound, e.g., a thermoset resin, that when polymerized, forms a hermetic seal between the package cover 308 and the cold plate 306. Here, coolant is delivered to the cold plate 306 through openings 322A disposed through the sealing material layer 322. As shown, the openings 322A are respectively in registration and fluid communication with the inlet/outlet openings 312 of the package cover 308 thereabove and the inlet/outlet openings 306A in the cold plate 306 therebelow. Typically, coolant lines 108 are attached to the device package 301 by use of connector features formed in the package cover 308, such as threads formed in the sidewalls of the inlet/outlet openings 312 and/or protruding features 314 that surround the inlet/outlet openings 312 and extend upwardly from the surface of the lateral portion 308B.

Beneficially, the sealing material layer 322 provides mechanical support that improves system reliability and extends the useful lifetime of the device package 301. For example, the second sealing material layer 322 may reduce mechanical stresses that can weaken interfacial bonds and/or electrical connections between electrical components of the device package 301, such as stresses caused by vibrations, mechanical and thermal shocks, and/or fatigue caused by repeated thermal cycles. In some embodiments, the sealing material layer 322 may be a thermally conductive material, such as a polymer or epoxy having one or more thermally conductive additives, such as silver and/or graphite. In some embodiments, the device package 301 further includes a support member 307 attached to the upward-facing side of the cold plate 306, the support member 307 may be formed of a rigid material, e.g., a metal or ceramic plate, that provides mechanical support to the cold plate 306. The support member 307 may be attached to the cold plate 306 using a direct bonding method or by use of an intervening adhesive layer (not shown).

Figure 4A:
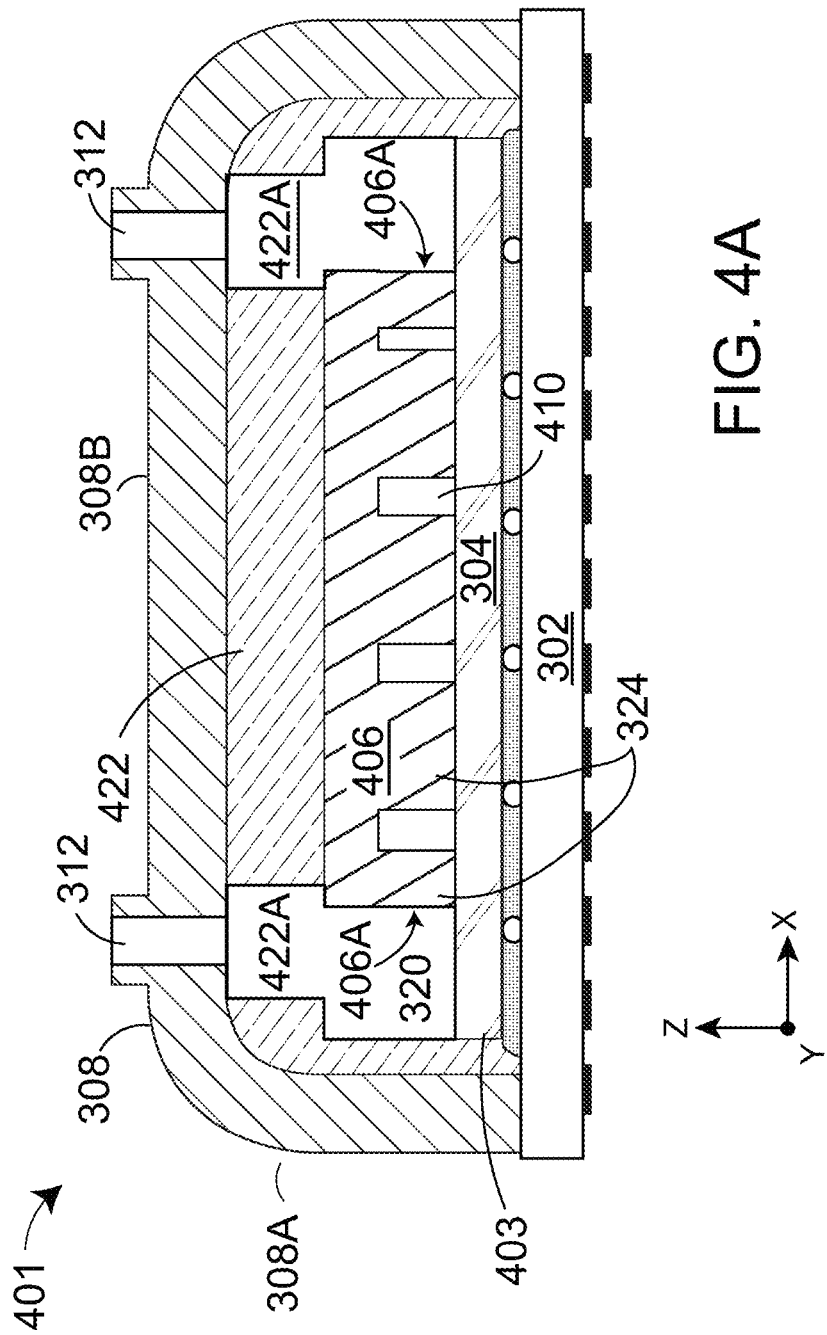
FIG. 4A is a schematic sectional view of device package, according to another embodiment, that may be used with the system panel.

FIG. 4A is a schematic sectional view of device package 401, according to another embodiment, that may be used with the system panel 100. Here, the device package 401 includes a package substrate 302, a package cover 308, an integrated cooling assembly 403 disposed between the package substrate 302 and the package cover 308, and a sealing material layer 422 disposed between the integrated cooling assembly 403 and the package cover 308.

FIG. 4B is an exploded bottom up isometric view of the integrated cooling assembly 403 illustrated in FIG. 4A. The cooling assembly 403 generally includes a device 304 and a cold plate 406 attached to the backside of the device 304, e.g., by use of a direct bonding method described above. The cold plate 406 generally includes a patterned side that faces towards the device 304 and defines the upper portion of a coolant channel 410, and an opposite side that faces towards the package cover 308. Here, the patterned side forms a device-facing cavity comprising a base surface 409 and opposing sidewalls 411 that protrude downwardly from the base surface 409. When attached to the device 304 disposed therebelow, e.g., by direct bonding of the side surfaces 413 to the device backside 320, the sidewalls 411 define the sides of a coolant channel 410, the base surface 309 forms an uppermost surface of the coolant channel 410, and the device backside 320 forms a bottom surface the coolant channel 410. Here, coolant is circulated through the coolant channel 410 through openings 406A disposed on opposite ends of the cooling assembly 403.

As shown, the openings 406A each comprise a gap between the cooling assembly 403 and the device backside 320 disposed therebelow. The gap is formed at the ends of the cold plate 406 that do not include sidewalls (as shown) or that include sidewalls that only partially extend towards the backside of the device 304 and are not bonded thereto. The openings 406A are in fluid communication with the inlet/outlet openings 312 of the package cover 308 through openings 422A formed in the sealing material layer 422. As shown, the length cold plate 406 in the X direction is less than that of the device 304 and the openings 422A through the sealing material layer 422 extend from the package cover 308 to the end portions of the device backside disposed therebelow. In other embodiments, sidewalls 411 may have substantially the same length as the device 304, as shown in phantom, and the base surface 409 may have a length that is less than the length of the device 304. In either embodiment, the device backside 320 is in direct thermal contact with coolant circulated through the coolant channel 410 and with coolant entering and exiting the coolant channel 410 on either side of the openings 406A. It is contemplated that the cooling assembly 403 and sealing material layer 422 illustrated in FIGS. 4A-4B may be used with any of the device packages described herein.

Figure 5:
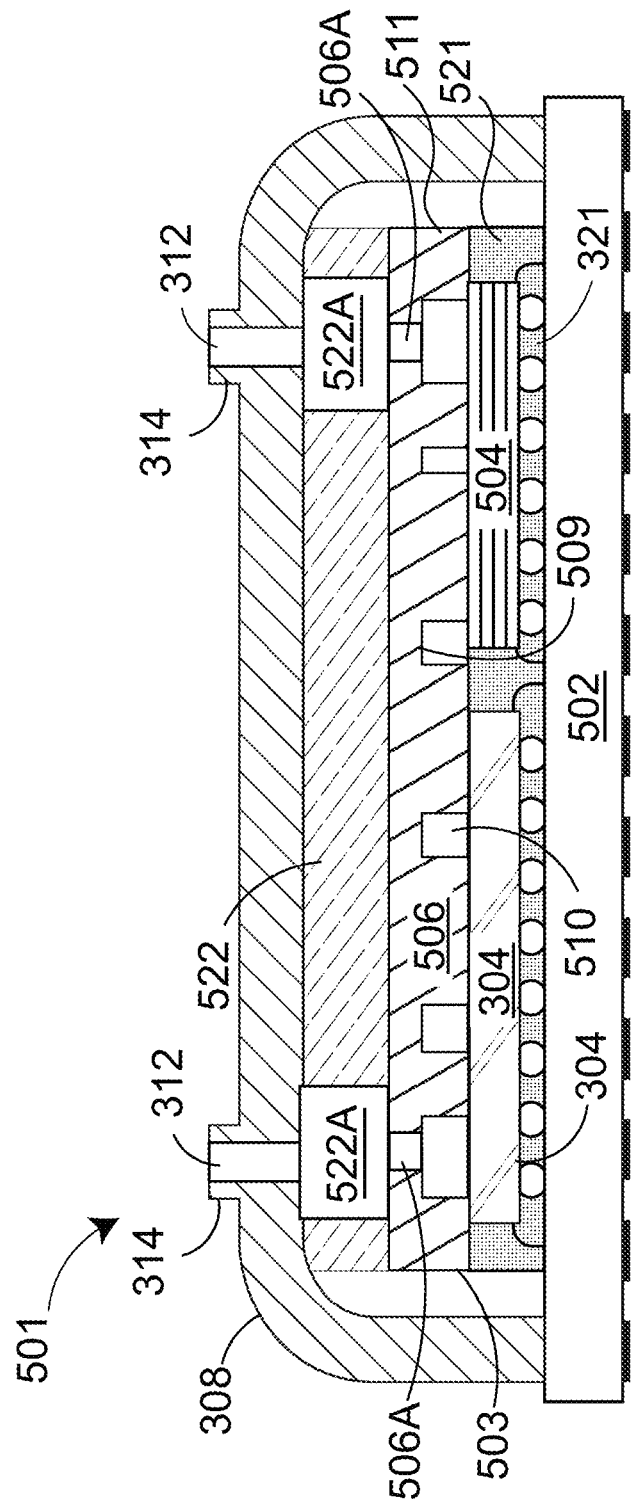
FIG. 5 is a schematic side-sectional view of an example of a multi-component device package that includes a cold plate directly bonded to the backside surfaces of two or more devices.

FIG. 5 is a schematic side sectional view of an example of a multi-component device package 501 that includes a cold plate 506 directly bonded to the backside surfaces of two or more devices. As shown, the device package 501 includes a package substrate 502, e.g., an interposer that facilitates communication between the device 304 and a device stack 504, an integrated cooling assembly 503, a package cover 308, and a sealing material layer 522. The integrated cooling assembly 503 may include a plurality of devices 304 (one shown) which may be singulated and/or disposed in the vertical device stacks 504 (one shown), and a cold plate 306 attached to each of the devices 304 and device stacks 504, e.g., by the direct bonding methods described herein. In some embodiments, the device 304 may comprise a processor and the device stack 504 may comprise a plurality of memory devices. Here, the device 304 and the device stack 504 are disposed in a side-by-side arrangement on the package substrate 302 and are in electrical communication with one another through conductive elements formed in, on, or through the package substrate 502. Here, the cold plate 506 is sized to provide a bonding surface for attachment to both the device 304 and the device stack 504 but may otherwise be the same or substantially similar to other cold plates described herein. For example, here the cold plate 506 includes a patterned side comprising a base surface 509 and sidewalls 511 that extend downward from the base surface 509 to define a cavity. The cavity may be closed, e.g., surrounded by sidewalls 511, as shown, or may be open at either end as shown in FIGS. 4A-4B. The base surface 509 defines the uppermost surface of a coolant channel 510, and the sidewalls 511 may define the peripheral or the side boundaries of the coolant channel 510. Here, the device 304 and the device stack 504 define respective portions of the bottom of the coolant channel 510 and a second underfill layer 521 or other molding material disposed in the gap regions between the device 304 and the device stack 504 provide the intervening bottom portions of the coolant channel disposed between the device 304 and the device stack 504.

The sealing material layer 522, disposed between the cold plate 506 and package cover 308, attaches the cold plate 506 to the package cover 308 and forms a coolant-impermeable barrier therebetween. Coolant is circulated to the device package 501 through the inlet/outlet openings 312 of the package cover 308 and flows through the coolant channel 510 via openings 506A in the cooling assembly 503 and corresponding openings 522A formed through the sealing material layer 522. Here, the sealing material layer 522 may be formed of a polymer or epoxy molding material, such as described above, or a compliant adhesive layer, such as a TIM layer.

Figure 6:
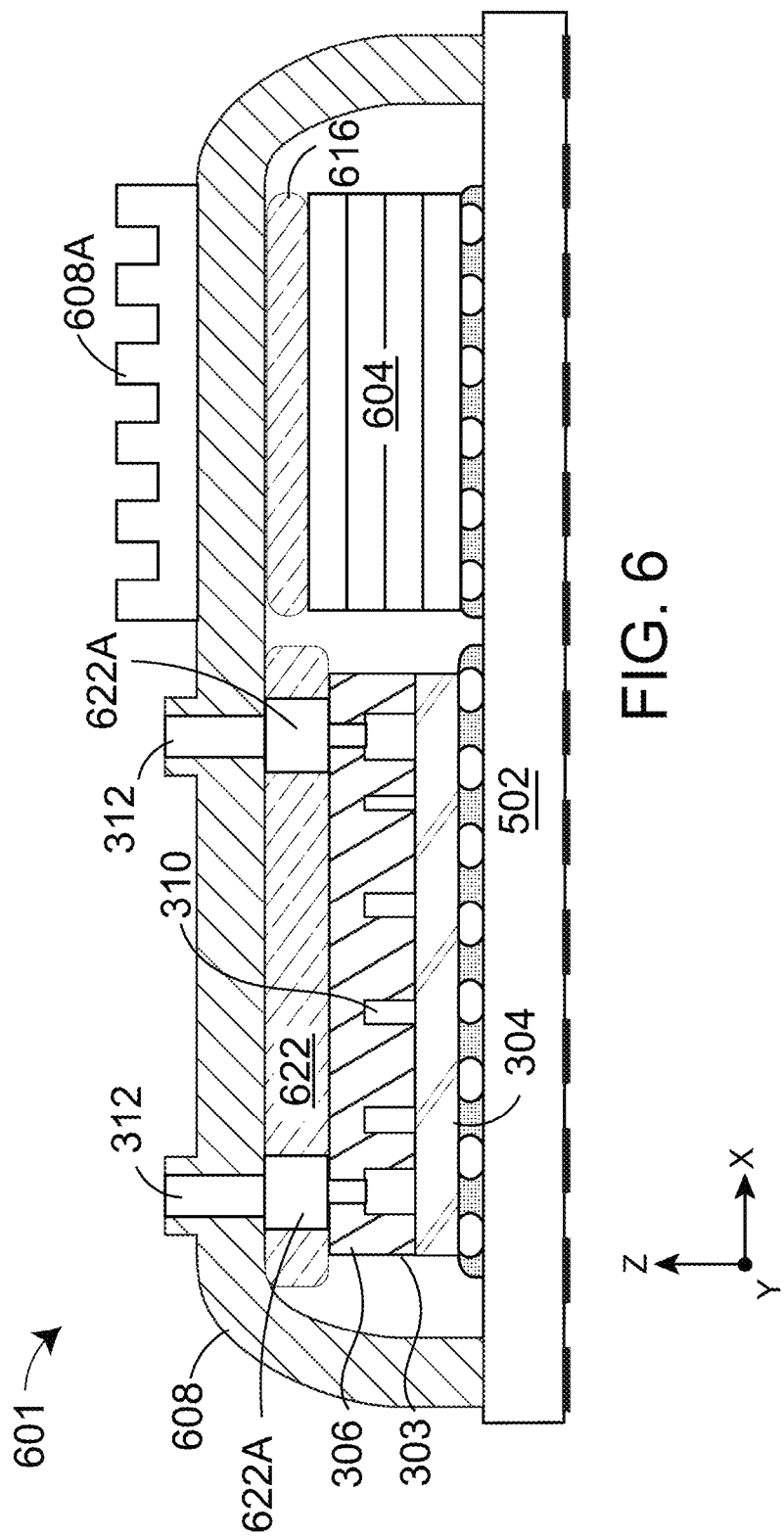
FIG. 6 is a schematic side sectional view of an example multi-component device package, according to an embodiment of the disclosure.

FIG. 6 is a schematic side sectional view of an example multi-component device package, according to an embodiment of the disclosure. Here, the device package 601 includes a package substrate 502, an integrated cooling assembly 303, one or more second devices (shown here as a device stack 604), and a package cover 608. The device package 601 further includes a sealing material layer 622, disposed between the integrated cooling assembly 303 and the portion of the package cover 608 disposed thereover. The sealing material layer 522 forms a coolant-impermeable barrier between the cold plate 306 and the package cover 308. Here, the device stack 604 is disposed on the package substrate 502 in a side-by-side arrangement with the device 304. Heat generated by the device 304 is dissipated to a coolant that is circulated through the coolant channel 310. Here, the coolant is circulated via inlet/outlet openings 312 in the package cover 608, openings 622A disposed through the sealing material layer 622 in registration and fluid communication with the inlet/outlet openings 312, and openings 306A in the cold plate 306 in fluid communication with the openings 622A.

The package cover 608 may be formed of a thermally conductive material and function as a thermal spreader. Beneficially, the cold plate 306 blocks a thermal pathway between the device 304 and the device stack 604 to prevent heat from transferring therebetween. Thus, heat generated by the device stack 604 may be dissipated to the coolant via the package cover 608 which is thermally coupled to the device stack 604 by use of a TIM layer 616. Thus, the device package 601 may be advantageously used to facilitate closely spaced devices on an interposer, such as high-power devices and memory stacks, to provide for reduced latency while simultaneously eliminating undesirable heat transfer therebetween. In some embodiments, the device package 601 further includes a heat sink 608A disposed on a portion of the package cover 608 above the device stack 604. The heat sink 608A may be thermally coupled to the package cover 608 by use of a TIM layer (not shown) or by direct bonding using the methods described herein.

Figure 7:
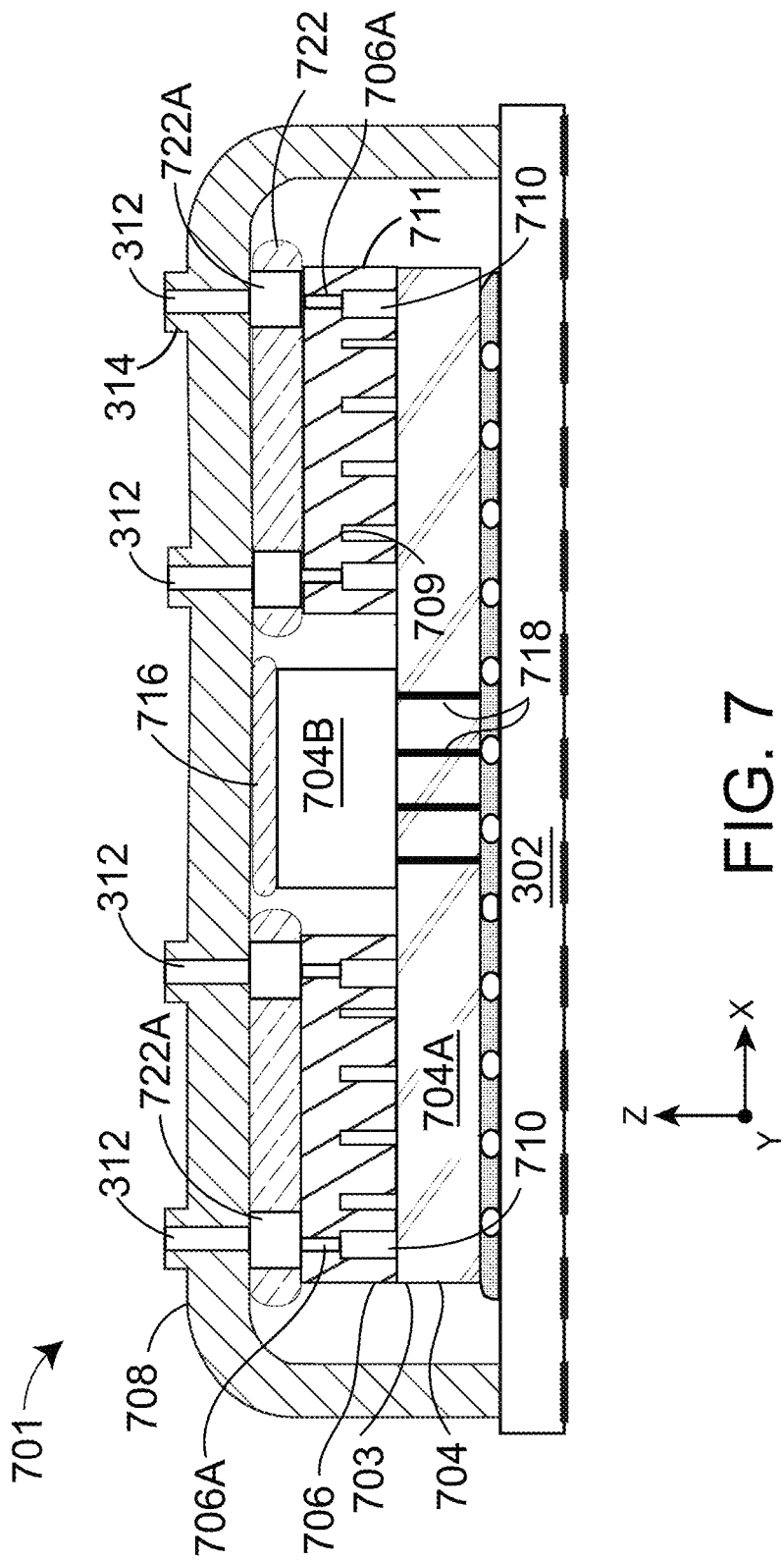
FIG. 7 is a schematic side section view of a 3DIC device package, according to an embodiment of the disclosure.

FIG. 7 is a schematic side section view of a 3DIC device package 701, according to an embodiment of the disclosure. Generally, the device package 701 includes an integrated cooling assembly 703 disposed on and electrically connected to the package substrate 302, a package cover 708 disposed over the integrated cooling assembly 703, and a sealing material layer 722 disposed between the cooling assembly 703 and the package cover 708. Here, the integrated cooling assembly 703 includes a 3DIC device 704, which includes a first device 704A, one or more second devices 704B (one shown), and one or more cold plates 706 (two shown). Here, the first device 704A is disposed facing towards the package substrate 302, i.e., active-side down, and the second device 704B is disposed on and bonded to a portion of a backside of the first device 704A. The package substrate 302 and the second device 704B and/or the first device 704A and the second device 704B may be interconnected using a plurality of through substrate vias (TSVs 718) disposed through the first device 704A, and hybrid bonds formed between the active side of the second device 704B and the backside of the first device 704A. In some embodiments, the one or more second devices 704B include a device stack, e.g., the device stack 604, directly bonded to and interconnected with the first device 704A using direct hybrid bonds.

Here, the first device 704A is cooled using the one or more cold plates 706 which are disposed on and bonded to the backside of the first device 704A in a side-by-side arrangement with the second device 704B. Each of the one or more cold plates 706 are attached to the package cover 708 using a sealing material layer 722, where the sealing material layer 722 forms a coolant impermeable barrier between the cold plate 706 and the package cover 708.

Here, each of the cold plates 706 includes a base surface 709 and sidewalls 711 extending downward from the base surface 709, where the sidewalls 711 are attached to the first device 704A, e.g., by use of a direct bonding method, to form a coolant channel 710 between the cold plate 706 and the portion of the first device 704A disposed therebelow. Heat generated by respective portions of the first device 704A is dissipated from the device package 701 via coolant flowing through the coolant channels 710. Here, the coolant is delivered to each of the coolant channels 710 through a flow path that includes inlet/outlet openings 312 in the package cover 708, openings 722A in the sealing material layers 722, and openings 706A in the cold plates 706.

Here, the second device 704B, is thermally coupled to the package cover 708 by use of a TIM layer 716 and the sealing material layers 722 and package cover 708 each comprise thermally conductive materials. Thus, heat generated by the second device 704B is transferred to the coolant in the coolant channels 710 via a heat transfer path that includes the TIM layer 716, the package cover 708, the sealing material layer 722, and the cold plates 706. In some embodiments, heat from the second device 704B is dissipated using a heat sink attached to the portion of the package cover 708 disposed over the second device 704B, such as the heat sink 608A described above.

In each of the embodiments described above, the sealing material layers and the openings disposed therethrough facilitate delivery of a coolant to an integrated device assembly without direct attachment of coolant lines thereto. Attachment of the coolant lines to the package cover reduces manufacturing complexity and costs as the package covers are typically formed from a less brittle material than that used to form the cold plates and thus are less prone to breakage.

Figure 8:
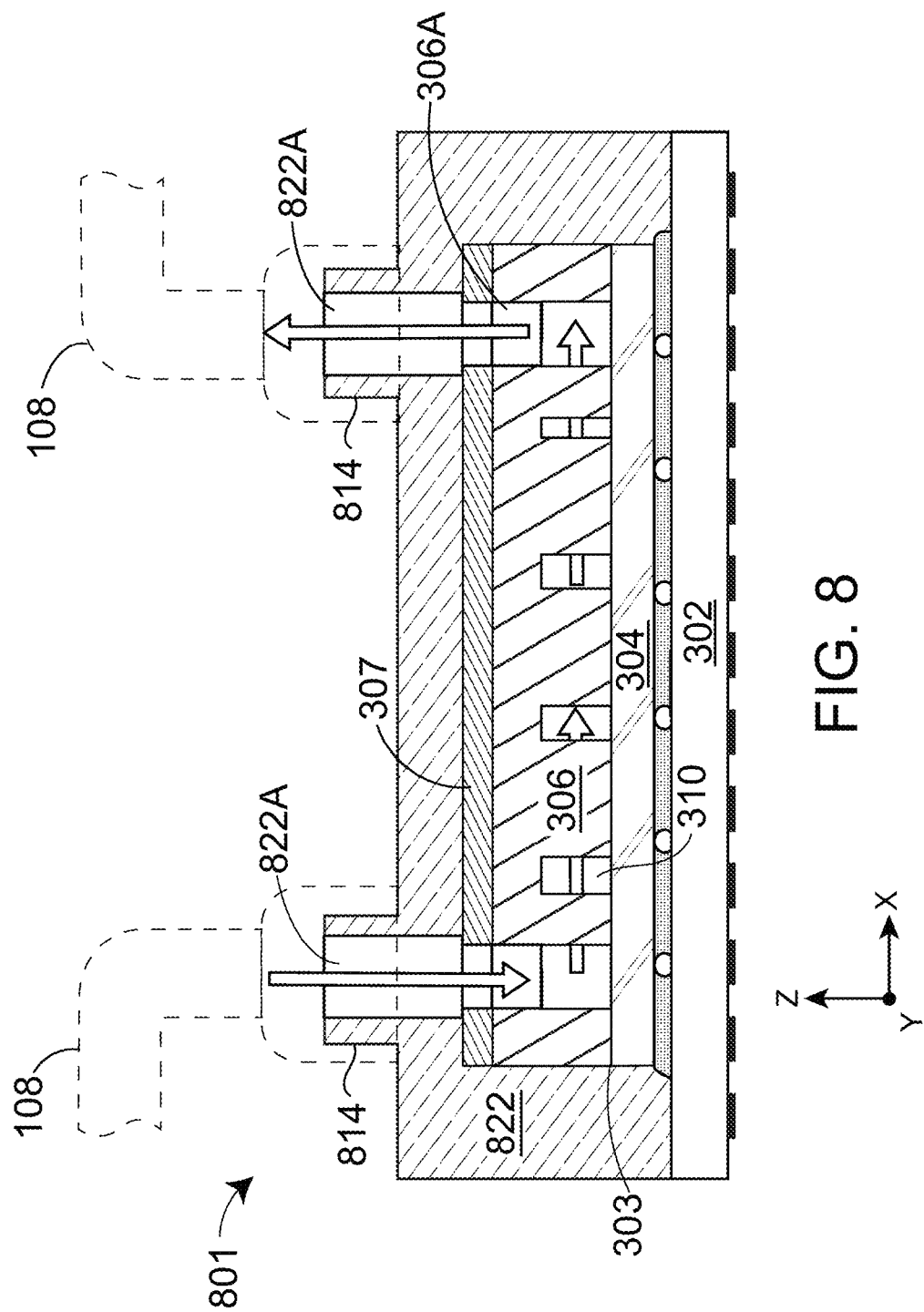
FIG. 8 is a schematic side section view of a device package, according to an embodiment of the disclosure.

FIG. 8 is a schematic side section view of a device package 801, according to an embodiment of the disclosure. Here, the device package 801 includes a package substrate 302, a cooling assembly 303 disposed on the package substrate 302, and a material layer 822 disposed over and at least partially encapsulating the cooling assembly 303. The material layer 822 forms a coolant impermeable seal with the cooling assembly 303 and may comprise a polymer or epoxy formed from a resin or molding compound. Coolant is delivered to the cooling assembly 303 and circulated therethrough via openings 822A disposed through the material layer 822B. Here, the material layer 822 includes one or more features 814, such as threads or protrusions that extend upwardly to surround each of the openings 822A, where the features 814 provide for the connection of coolant lines 108 (shown in phantom) directly to the material layer 822. In some embodiments, the device package 801 further includes a package cover (not shown) and the coolant lines are connected to the material layer 822 through openings disposed in the package cover.

Figure 9:
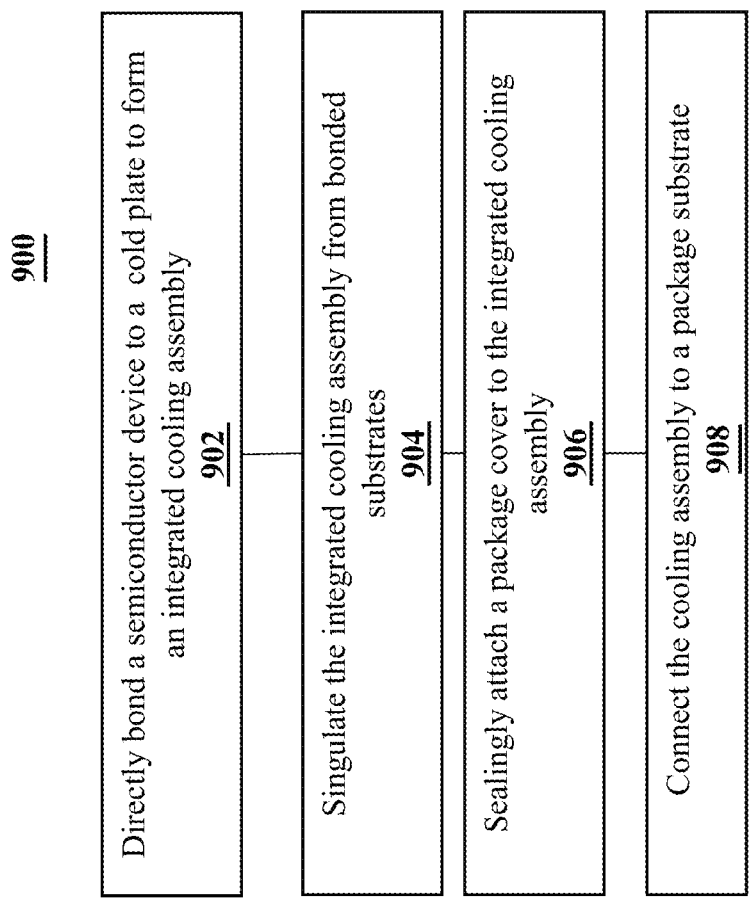
FIG. 9 shows a method that can be used to manufacture the device packages described herein.
Figure 10:
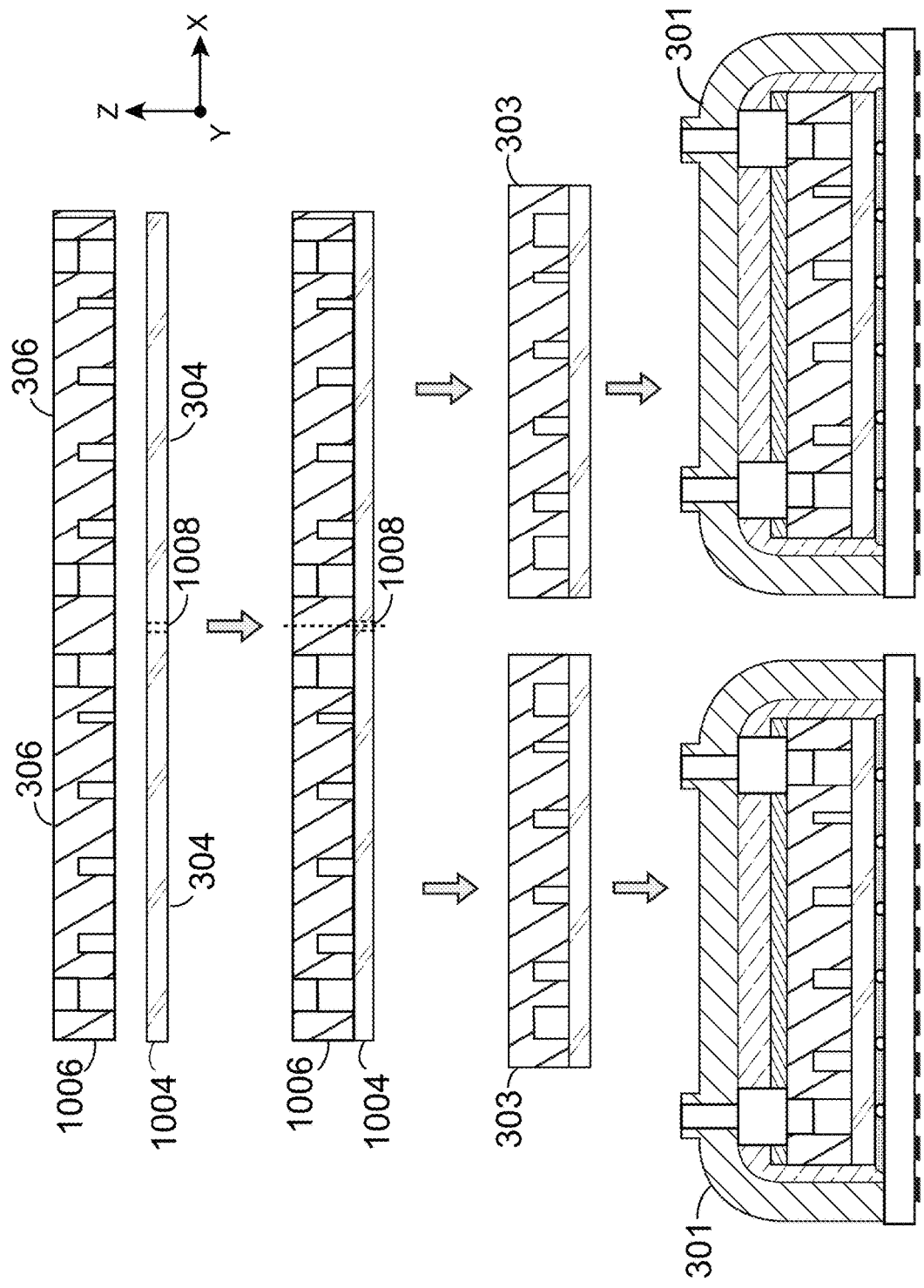
FIG. 10 shows the device package at different stages of manufacturing to illustrate aspects of the method.

FIG. 9 shows a method 900 that can be used to manufacture the device packages described herein. FIG. 10 shows the device package 301 at different stages of manufacturing to illustrate aspects of the method 900. It is contemplated that the method 900 can be used to manufacture any of the device packages described herein. To reduce visual clutter, some of the features of the device packages 301 illustrated in FIG. 10 are made with reference numbers found in FIG. 3.

At block 902, the method 900 includes aligning a first substrate 1004 with a second substrate 1006, where the first substrate 1004 includes a plurality of to-be-singulated die, e.g., devices 304, and the second substrate 1006 includes a plurality of to-be-singulated cold plates 306. As shown, the first substrate 1004 includes a plurality of the devices 304 arranged in a rectangular array and spaced apart from one another by a plurality of scribe lines 1008 that extend in the X and Y directions to form a grid pattern.

The first substrate 1004 may include a bulk material, and a plurality of material layers disposed on the bulk material. The bulk material may include any semiconductor material suitable for manufacturing semiconductor devices, such as silicon, silicon germanium, germanium, group III-V semiconductor materials, group II-VI semiconductor materials, or combinations thereof. For example, in some embodiments, the first substrate 1004 may include a monocrystalline wafer, such as a silicon wafer, a plurality of device components formed in or on the silicon wafer, and a plurality of interconnect layers formed over the plurality of device components. In other embodiments, the substrate may comprise a reconstituted substrate, e.g., a substrate formed from a plurality of singulated devices embedded in a support material.

The bulk material of the first substrate 1004 may be thinned after the devices 304 are formed using one or more backgrind, etching, and polishing operations that remove material from the backside. Thinning the first substrate 1004 may include using a combination of grinding and etching processes to reduce the thickness (in the Z-direction) to about 450 µm or less, such as about 301 µm or less, or about 150 µm or less. After thinning, the backside may be polished to a desired smoothness using a chemical mechanical polishing (CMP) process, and the dielectric material layer may be deposited thereon. In some embodiments, the dielectric material layer may be polished to a desired smoothness to prepare the first substrate 1004 for the bonding process. In some embodiments, the method 900 includes forming the plurality of metal features in the dielectric material layer in preparation for a hybrid bonding process, such as by use of a damascene process.

In some embodiments, the active side is temporarily bonded to a carrier substrate (not shown) before or after the thinning process. When used, the carrier substrate provides support for the thinning operation and/or for the thinned material to facilitate substrate handling during one or more of the subsequent manufacturing operations described herein. In some embodiments, the second substrate 1006 is formed of a plurality of substrates (not shown), each comprising a unitary bulk material patterned to define a plurality of base plates that when bonded to one another, collectively form a plurality of cold plates 306. Each of the plurality of substrates may have substantially the same size and shape as the first substrate 1004 when viewed from top-down (in the Z-direction) so that the interfacing surfaces are substantially coextensive with one another. In some embodiments, each of the substrates has a thickness (in the Z-direction) of between about 0.5 mm and about 10 mm, or between about 1 mm and about 8 mm, or between about 1 mm and 6 mm, such as about 0.5 mm or more, such as about 1 mm or more, or about 2 mm or more, or about 10 mm or less, such as about 8 mm or less, or about 6 mm or less.

In some embodiments, the second substrate 1006 is formed of a bulk material having a substantially similar CTE to the bulk material of the first substrate 1004, where the CTE is a fractional change in length of the material (in the X-Y plane) per degree of temperature change. In some embodiments, the CTEs of the first and second substrates are matched so that the CTE of the second substrate 1006 is within about +/−20% or less of the CTE of the first substrate 1004, such as within +/−15% or less, within +/−10% or less, or within about +/−5% or less when measured across a desired temperature range. In some embodiments, the CTEs are matched across a temperature range from about −60° ° C. to about 100° C. or from about 60° ° C. to about 175° C. In one example embodiment, the matched CTE materials each include silicon. For example, the bulk material of the first substrate 1004 may include monocrystalline silicon, and the bulk material of the second substrate 1006 may include monocrystalline silicon or polycrystalline silicon. In some embodiments, the method 900 includes forming a dielectric material layer and, optionally, a plurality of metal features on the lower surface of the second substrate 1006. In some embodiments, the method includes patterning the second substrate 1006, e.g., by use of lithography and etching processes, to form the respective surfaces, sidewalls, and protruding features of the cold plates described herein.

At block 904, the method 900 includes directly bonding the plurality of cold plates 306 formed in the second substrate 1006 to the plurality of devices 304 in the first substrate 1004. As described above, the bonding surfaces may each comprise a dielectric material layer, and directly bonding the first and second substrates 1004, 1006 includes forming dielectric bonds between the first dielectric material layer 334A and the second dielectric material layer 334B. Optionally, the first and second substrates 1004, 1006 may be directly bonded using a hybrid of the dielectric bonds and metal bonds formed between the metal features.

Generally, directly bonding the surfaces (of the dielectric material layers) includes preparing, aligning, and contacting the surfaces. Preparing the surfaces may include smoothing the respective surfaces to a desired surface roughness, such as between 0.1 to 3.0 nm RMS, activating the surfaces to weaken or open chemical bonds in the dielectric material, and terminating the surfaces with a desired species. Smoothing the surfaces may include polishing the substrates 1004, 1006 using a CMP process. Activating and terminating the surfaces with a desired species may include exposing the surfaces to radical species formed in a plasma.

In some embodiments, the plasma is formed using a nitrogen-containing gas, e.g., $N_2$, and the terminating species includes nitrogen and hydrogen. In some embodiments, the surfaces may be activated using a wet cleaning process, e.g., by exposing the surfaces to an aqueous ammonia solution. In some embodiments, the dielectric bonds may be formed using a dielectric material layer deposited on only one of the substrates 1004, 1006 but not on both. In those embodiments, the direct dielectric bonds may be formed by contacting the deposited dielectric material layer of one substrate directly with a bulk material surface of the other substrate, e.g., a bulk semiconductor or poly-silicon material surface. In such embodiments, the bulk material surface may comprise a thin layer of native oxide or may be cleaned prior to contact so that it is substantially free of native oxide.

Directly forming direct dielectric bonds between the substrates at block 904 includes bringing the prepared and aligned surfaces into direct contact at a temperature less than 150° C., such as less than 100° C., for example, less than 30° C., or about room temperature, e.g., between 20° C. and 30° C. Without intending to be bound by theory, it is believed that the hydrogen terminating species diffuse from the interfacial bonding surfaces, and chemical bonds are formed between the remaining nitrogen species during the direct bonding process. In some embodiments, the direct bond is strengthened using an anneal process, where the substrates are heated to and maintained at a temperature of greater than about 30° C. and less than about 450° C., for example, greater than about 50° C. and less than about 250° C., or about 150° C. for a duration of about 5 minutes or more, such as about 15 minutes. Typically, the bonds will strengthen over time even without the application of heat. Thus in some embodiments, the method 900 does not include heating the substrates.

In embodiments where the substrates are bonded using hybrid dielectric and metal bonds, the method may further include planarizing or recessing the metal features below the field surface before contacting and bonding the dielectric material layers. After the dielectric bonds are formed, the substrates 1004, 1006 may be heated to a temperature of 150° C. or more and maintained at the elevated temperature for a duration of about 1 hour or more, such as between 8 and 24 hours, to form direct metallurgical bonds between the metal features. Suitable direct dielectric and hybrid bonding technologies that may be used to perform aspects of the methods described herein include ZiBond® and DBIR, each of which are commercially available from Adeia Holding Corp., San Jose, CA, USA.

At block 906, the method 900 includes singulating the integrated cooling assemblies 303 from the bonded substrates. Singulation after bonding imparts distinctive structural characteristics on the integrated cooling assemblies 303 as the bonding surface of each cold plate 306 has the same perimeter as the backside of the device 304 bonded thereto. Thus, the sidewalls of the cold plate 306 are typically flush with the edges of the device 304 about their common perimeters. In some embodiments, the cold plates 306 are singulated from the second substrate 1006 using a process that cuts or divides the second substrate 1006 in a vertical plane, i.e., parallel to the Z-direction. In those embodiments, the sides of the cold plate 306 are substantially perpendicular to the backside of the device, i.e., a horizontal (X-Y) plane of an attachment interface between the device 304 and the cold plate 306. In some embodiments, the cold plates 306 are singulated using a saw or laser dicing process.

At block 908, the method 900 includes connecting the integrated cooling assembly to the package substrate 302 and sealing the package cover 308 to the integrated cooling assembly 303 by use of a molding compound that when cured, forms a sealing material layer 322. In some embodiments, the method 900 further includes forming openings 322A in the sealing material layer 322.

The methods described above advantageously provide for embedded cold plates that eliminate and/or substantially reduce the thermal resistance pathway typically associated with cooling systems attached to the exterior of a device package. The cold plates may be attached to a semiconductor device using a direct dielectric or hybrid dielectric and metal bonding method. Such bonding methods allow for relatively low thermal budgets while providing substantially increased bonding strengths when compared to conventional silicon-to-silicon bonding methods, such as thermocompression bonding methods.

The cold plate and the semiconductor device may be formed of CTE matched materials which eliminate the need for an intervening TIM layer. In some embodiments, the integrated cooling assembly and the package cover may be formed of CTE mismatched materials and attached to one another using a flexible material to form the sealing material layer, or by use of a decoupling adhesive layer disposed between the sealing material layer and one of the cold plate or the package cover. The flexible material may absorb the difference in linear expansion between the package cover and the cold plate during repeated thermal cycles to extend the useful lifetime of the device package.

The embodiments discussed above are intended to be illustrative and not limiting. One skilled in the art would appreciate that individual aspects of the cooling assemblies, device packages, and methods discussed herein may be omitted, modified, combined, and/or rearranged without departing from the scope of the disclosure. Only the claims that follow are meant to set bounds as to what the present disclosure includes.

What is claimed is:

1. A device package comprising:
    a package substrate;
    a package cover disposed on the package substrate, the package cover having an inlet opening and an outlet opening disposed therethrough;
    an integrated cooling assembly disposed between the package substrate and the package cover, the integrated cooling assembly comprising a semiconductor device and a cold plate attached to the semiconductor device; and
    a material layer disposed between the package cover and the cold plate, wherein:
        the cold plate comprises a patterned first side and an opposite second side;
        the patterned first side comprises a base surface and sidewalls extending downwardly from the base surface;
        the base surface is spaced apart from the semiconductor device to collectively define a coolant channel therebetween; and
        the coolant channel is in fluid communication with the inlet opening and the outlet opening through openings disposed through respective portions of the material layer.

2. The device package of claim 1, the cold plate is attached to the semiconductor device by direct dielectric bonds.

3. The device package of claim 1, wherein the cold plate is attached to the semiconductor device by direct hybrid bonds.

4. The device package of claim 1, further comprising a coolant fluid disposed in the coolant channel.

5. The device package of claim 1, wherein openings in the integrated cooling assembly comprise portions of a fluid path that further comprises the inlet and outlet openings, the openings disposed through the material layer, and the coolant channel.

6. The device package of claim 5, wherein the openings in the integrated cooling assembly extend between the first side and the second side of the cold plate.

7. The device package of claim 5, wherein the openings in the integrated cooling assembly comprise gaps between the first side of the cold plate and the semiconductor device.

8. The device package of claim 5, wherein the first side of the cold plate further comprises a plurality of protruding features that extend downwardly from the base surface to disrupt at least portions of the fluid flow path through the coolant channel.

9. The device package of claim 8, wherein the protruding features are directly bonded to the semiconductor device.

10. The device package of claim 7, wherein the gaps are disposed at opposite ends of the base surface.

11. The device package of claim 1, wherein the package cover comprises one or more coolant line attachment features.

12. The device package of claim 1, further comprising an underfill layer that at least partially encapsulates the integrated cooling assembly in regions outside of the coolant channel.

13. The device package of claim 1, wherein the material layer forms an impermeable barrier between the package cover and the cold plate.

14. The device package of claim 1, wherein side surfaces of the cold plate and the semiconductor device are substantially flush with one another.

15. The device package of claim 1, wherein:
    the semiconductor device is a first semiconductor device and the integrated cooling assembly further comprises a plurality of second semiconductor devices vertically arranged in a device stack; and
    the device stack is attached to the first side of the cold plate in a side-by-side arrangement with the first semiconductor device.

16. The device package of claim 15, wherein the cold plate is attached to the second semiconductor device by direct dielectric bonds.

17. The device package of claim 15, wherein the cold plate is attached to the second semiconductor device by direct hybrid bonds.

18. The device package of claim 1, wherein the semiconductor device is a first semiconductor device and the device package further comprises:
- a device stack electrically connected to the package substrate in a side-by-side arrangement with the integrated cooling assembly; and
- a first TIM layer disposed between the device stack and the package cover.

19. The device package of claim 18, wherein the package cover comprises a thermally conductive metal that forms a portion of a heat transfer path between the device stack and the coolant channel.

20. The device package of claim 18, further comprising a heat sink thermally coupled to an outside surface of the package cover, wherein the package cover comprises a thermally conductive metal that forms a portion of a heat transfer path between the device stack and the heat sink.

* * * * *